(12) United States Patent
Skendzic et al.

(10) Patent No.: US 11,906,557 B2
(45) Date of Patent: Feb. 20, 2024

(54) PROCESSING SINEWAVE SIGNALS OF VARIABLE FREQUENCY IN A DEVICE WITH FIXED PROCESSING RATES

(71) Applicant: Schweitzer Engineering Laboratories, Inc., Pullman, WA (US)

(72) Inventors: Veselin Skendzic, Schwenksville, PA (US); Daniel P. Dwyer, Bothell, WA (US); Chandrasekaran Swaminathan, Orefield, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/645,654

(22) Filed: Dec. 22, 2021

(65) Prior Publication Data

US 2023/0194584 A1 Jun. 22, 2023

(51) Int. Cl.
*G01R 23/02* (2006.01)
*G06F 1/03* (2006.01)
(Continued)

(52) U.S. Cl.
CPC ......... *G01R 23/02* (2013.01); *G01R 19/0015* (2013.01); *G01R 25/00* (2013.01); *G06F 1/03* (2013.01)

(58) Field of Classification Search
CPC ...... G01R 23/00; G01R 23/02; G01R 23/163; G01R 23/165; G01R 23/167; G01R 23/14; G01R 23/145; G01R 23/16; G01R 19/0007; G01R 19/0015; G01R 19/16509; G01R 25/00; G01R 25/08; G01R 19/2509; G01R 19/02; G01R 19/04; G01R 19/06; G01R 19/12; G01R 19/16528; G01R 19/16547;
(Continued)

(56) References Cited

U.S. PATENT DOCUMENTS

| | | | | |
|---|---|---|---|---|
| 5,721,689 | A * | 2/1998 | Hart | G01R 23/16 341/123 |
| 6,014,682 | A * | 1/2000 | Stephen | H04L 7/0029 708/276 |

(Continued)

OTHER PUBLICATIONS

Roscoe et al., "P and M Class Phasor Measurement Unit Algorithms Using Adaptive Cascaded Filters," in IEEE Transactions on Power Delivery, vol. 28, No. 3, pp. 1447-1459, Jul. 2013 (Year: 2013).*

(Continued)

*Primary Examiner* — Son T Le
*Assistant Examiner* — Matthew W. Baca
(74) *Attorney, Agent, or Firm* — Fletcher Yoder, P.C.; Bradley W. Schield (57) ABSTRACT

A method includes obtaining electrical measurements of an input signal of a power system. The electrical measurements are obtained at a sampling frequency and the input signal is indicative of an operating frequency of the power system. The method includes generating an intermediate signal from the input signal. The intermediate signal has a direct current (DC) component indicative of a magnitude and a phase of the input signal. The method includes filtering the intermediate signal using an adjustable length filter to obtain the magnitude and the phase of the input signal. The length of the adjustable length filter varies based at least in part on a period measurement of the power system.

20 Claims, 10 Drawing Sheets

(51) Int. Cl.
*G01R 19/00* (2006.01)
*G01R 25/00* (2006.01)

(58) Field of Classification Search
CPC .......... G01R 19/1658; G01R 19/16585; G01R 19/25; G01R 19/2513; G01R 31/40; G06F 1/03; H02H 3/50
See application file for complete search history.

(56) References Cited

U.S. PATENT DOCUMENTS

| | | |
|---|---|---|
| 6,603,298 B2 | 8/2003 | Guzman-Casillas |
| 8,140,283 B2 | 3/2012 | Benmouyal |
| 10,312,041 B2 | 6/2019 | Kasztenny |
| 2004/0107078 A1* | 6/2004 | Chiu ................. H03H 17/0294 703/2 |
| 2017/0110875 A1* | 4/2017 | Schweitzer, III ........ H02H 3/50 |

OTHER PUBLICATIONS

Mendonca et al., "Adjustable window for amplitude estimation considering the time-varying frequency of power systems signals," 2015 IEEE 24th International Symposium on Industrial Electronics (ISIE), Buzios, Brazil, 2015, pp. 1327-1332, doi: 10.1109/ISIE.2015.7281665. (Year: 2015).*

* cited by examiner

PROCESSING SINEWAVE SIGNALS OF VARIABLE FREQUENCY IN A DEVICE WITH FIXED PROCESSING RATES

TECHNICAL FIELD

This disclosure relates to signal processing of intelligent electronic device (IEDs) in an electric power delivery system. More particularly, this disclosure relates to obtaining electrical measurements of a power system that operates at a variable frequency with IEDs that obtain samples at a fixed processing rate.

DETAILED DESCRIPTION

Electric power delivery systems carry electricity from power generation systems to residential communities, factories, industrial areas, and other electricity consumers. Intelligent electronic devices (IEDs), such as protective relays, may obtain electrical measurements from electrical signals of the power system, make decisions based on these electrical measurements, and issue commands to protect equipment on the electric power delivery system. Some calculations and measurements, such as one cycle direct current (DC) component, a root mean square (RMS) component, real and reactive power calculations, fundamental frequency phasors, and fundamental frequency harmonic measurements, depend on obtaining accurate phase and magnitude measurements. The frequency of the electrical power delivery system may vary over time and may be constantly tracked by the IEDs to produce accurate measurements IEDs may achieve frequency tracked measurements by constantly adjusting the data acquisition and signal processing rate to follow the power system frequency. However, variable processing rates resulting from this action make it difficult to exchange the measurement results among multiple IEDs, resulting in increased latency and varying communication delays. Furthermore, some of the applications such as streaming of sampled value data and Synchrophasor measurements require constant sample rate synchronized to an externally supplied time reference.

The IEDs may receive the measurements at a constant sampling rate and may process at a fixed processing rate to ensure efficient communication between devices of the electric power delivery system while maintaining a synchronous time between devices. Despite operating at a substantially fixed processing rate, an IED may need to be able to accommodate changes in the frequency of the electric power delivery system. Indeed, the frequency of the electric power delivery system may be used to perform measurements over a single cycle or an integer multiple of cycles with calculations adjusted accordingly when the power delivery system frequency changes.

The present disclosure describes systems and techniques to perform computationally efficient power system measurements using a constant data acquisition and constant signal processing rates while simultaneously tracking the power system frequency and performing measurements over an integer number of power system cycles. Constant data acquisition and constant signal processing rates may further be synchronized among a plurality of IEDs and may be locked to a globally available time source, such as a global navigation satellite system (GNSS). Processed output data can be obtained at any time, allowing full decoupling between the tracked power system frequency and the signal processing rate.

Figure 1:
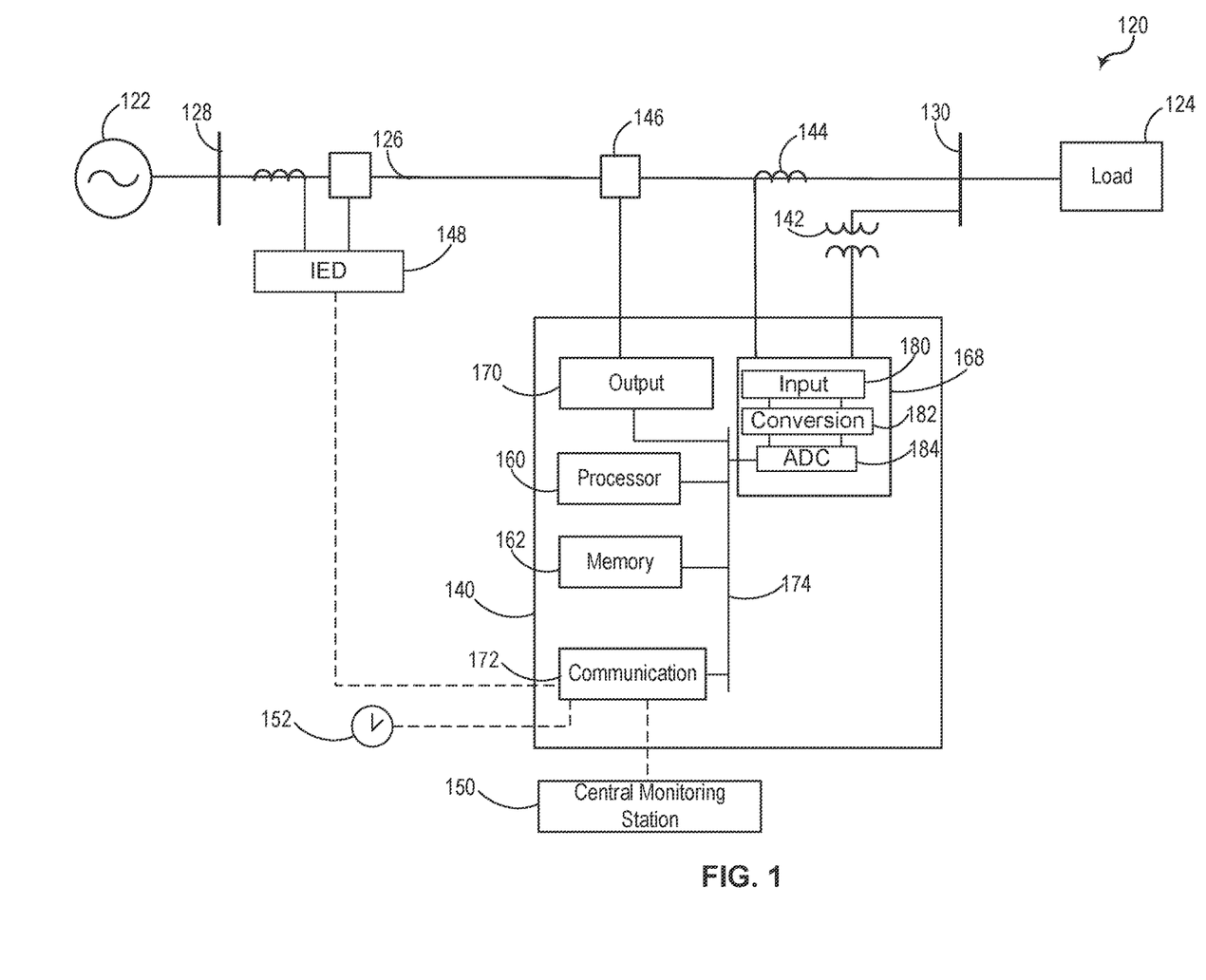
FIG. 1 is a schematic diagram of an intelligent electronic device (IED) of an electric power delivery system, in accordance with an embodiment.

FIG. 1 is a one line diagram of an electric power delivery system 120 that may be used to generate, transmit, and/or distribute electric energy to various loads. As illustrated, a power source 122, such as a generator, may generate and provide electrical energy to one or more loads 124 via a power line 126 and buses 128 and 130. Although illustrated in single-line form for purposes of simplicity, the electric power delivery system 120 may be part of a larger multiphase system, such as a three-phase electric power delivery system.

The electric power delivery system 120 may be monitored and/or protected by one or more electronic devices, such as intelligent electronic devices (IEDs) 140. As used herein, an IED (such as IED 140) may refer to any microprocessor-based device that monitors, controls, automates, and/or protects monitored equipment within the electric power delivery system 120. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. The IED 140 may obtain electric measurements (e.g., current and/or voltage measurements) via analog signals from sensors, such as potential transformers (PTs) 142, current transformers (CTs) 144, Rogowski coils, voltage dividers, or the like. In other embodiments, the IEDs may obtain digital signals representative of analog measurements from merging units, which obtain electrical signals from the power system and communicate the digitized analog signals to the IED 140.

The IED 140 may be communicatively connected to a circuit breaker (CB) 146 to perform protection and/or control operations on the electric power delivery system 120. For example, the IED 140 may detect currents, via the CTs 144, that exceed a threshold current indicating that a fault has occurred on the electric power delivery systems 120. Upon detecting a fault, the IEDs 140 may send a trip signal to the CB 146, thereby isolating the fault from the remaining electric power delivery system 120.

The IED 140 may communicate power system data with other electronic devices, such as other IEDs 148 and/or a central monitoring station 150, to improve protection of the power system. For instance, the IED 140 may communicate fault information (e.g., distance, direction, type, etc.), voltage measurements, current measurements, frequency measurements to improve protection of the power system. In some embodiments, the IED 140 may receive a synchronized clock signal, such as a global positioning system (GPS) clock signal, from a time source, which may be from a synchronized clock device 152, another IED 148, or a central monitoring system 150.

The IED 140 includes one or more processor(s) 160, a computer-readable storage medium 162, sensor circuitry 168, output circuitry 170, and communication circuitry 172. The IED 140 may include one or more bus(es) 174 connecting the processor 160 or processing unit(s) to the computer-readable storage medium 162, the sensor circuitry 168, the output circuitry 170, the communication circuitry 172. The computer-readable storage medium 162 may be embodied as memory, such as random access memory (RAM), read only memory (ROM), or a combination thereof, and may include or interface with software, hardware, or firmware modules for implementing various portions of the systems and methods described herein. The computer-readable storage medium 162 may be the repository of executable instructions configured to implement any of the processes described herein.

The processor 160 may process inputs received via the sensor circuitry 168 and the communication circuitry 172. The processor 160 may operate using any number of processing rates and architectures. The processor 160 may be configured to perform various algorithms and calculations described herein using computer executable instructions stored on computer-readable storage medium 162. The processor 160 may be embodied as a microprocessor. In certain embodiments, the processor 160 and/or the computer-readable storage medium 162 may be embodied as discrete electrical components, a general purpose integrated circuit, one or more Application Specific Integrated Circuits ("ASICs"), a Field Programmable Gate Array ("FPGA"), and/or other programmable logic devices.

As illustrated, the sensor circuitry 168 may include, for example, input terminals 180 or connectors that receive voltage signal(s) and current signal(s) from PTs 142 and CTs 144. The sensor circuitry 168 may transform the current and voltage signals using conversion circuits 182 to a level that may be measured and sample the signals using, for example, A/D converter(s) 184 to produce digital signals representative of measured voltage and measured current on the power line. The A/D converter 184 may be connected to the processor 160 by way of the bus 174, through which digitized representations of voltage signals may be transmitted to the processor 160. The processor 160 may send signals to trip the circuit breaker (CB) 146 depending on the electrical conditions of the power line and/or the communication signals from other IEDs.

The communication circuitry 172 may include communication ports, such as ethernet ports, serial ports, and/or fiber optic ports. Further, the communication circuitry 172 may include a transceiver to communicate with one or more electronic devices, such as the other IED 148 and/or the central monitoring system 150.

A common time signal 152 may be distributed throughout the electric power delivery system 120. Utilizing a common time source may ensure that IEDs have a synchronized time signal that can be used to generate time synchronized data, such as synchrophasors. The time signal may be distributed in the electric power delivery system 120 using a communications network and/or using a common time source, such as a Global Navigation Satellite System ("GNSS"), or the like.

The IED 140 may process an input signal, such as a voltage signal or a current signal from the PT 142 or the CT 144, to measure the operating frequency of the power system 120.

Figure 2:
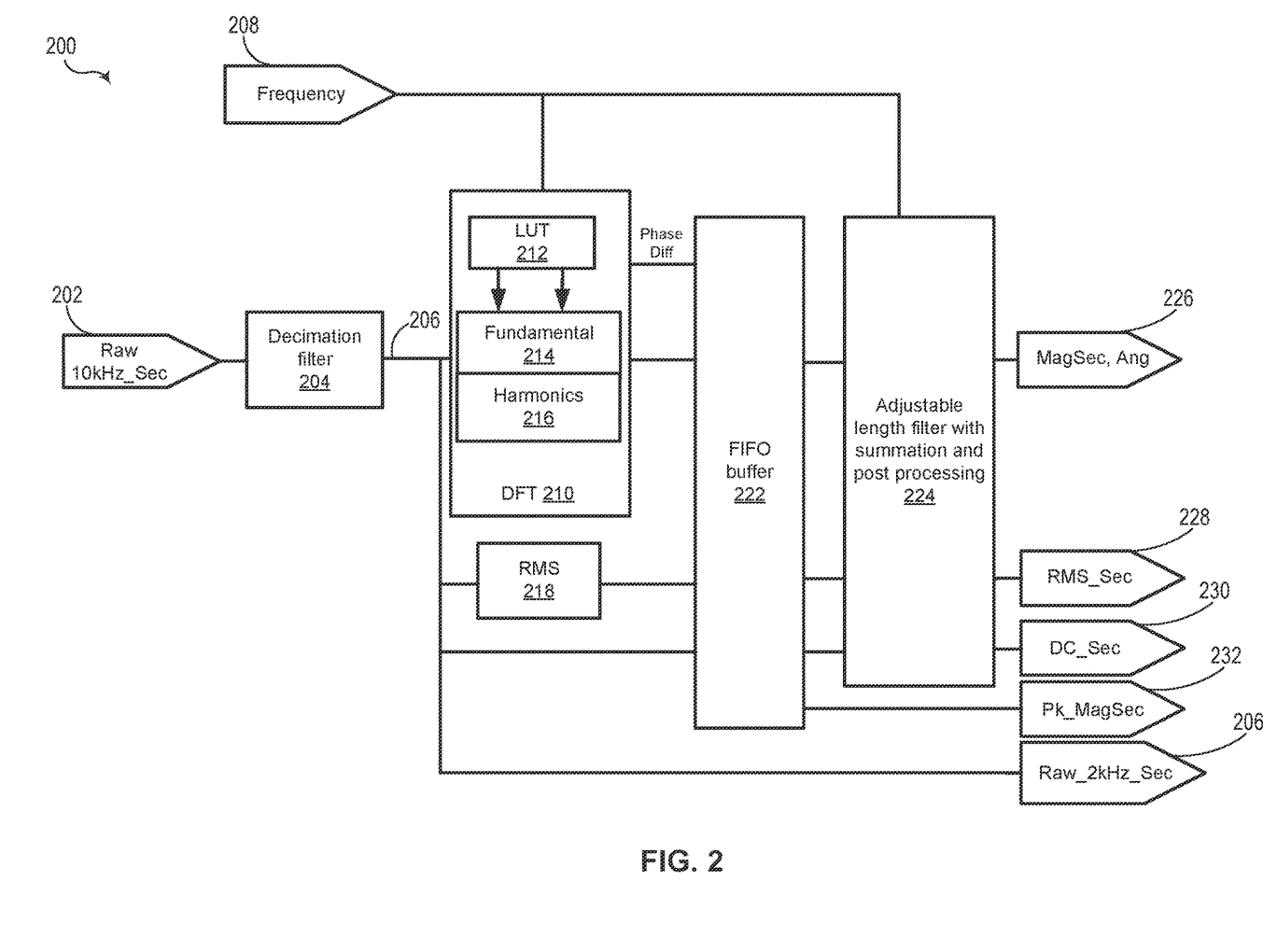
FIG. 2 is a block diagram of a signal processing system of the IED of FIG. 1, in accordance with an embodiment.

FIG. 2 is a block diagram of a signal processing system 200 incorporated into a component of the electric power delivery system 120, such as within the IED 140, in accordance with an embodiment of the present disclosure. The signal processing system 200 may include a decimation filter 204 (e.g., a cascaded integrator-comb (CIC) filter), discrete Fourier transform (DFT) block 210, root mean square (RMS) calculation (squaring) block 218, buffer 222, and an adjustable length windowing block 224. The decimation filter 204 may downsample an input signal 202 to generate a decimated input signal 206 having a reduced rate thus reducing the number of calculations required by the subsequent blocks. For example, the input signal 202 may be a multi-channel (e.g., 2, 4, 8 channels), high frequency (e.g., 8 kHz to 50 MHz) signal corresponding to a multi-phase voltage and/or multi-phase current. The decimation filter 204 may downsample the input signal 202 at an integer rate (e.g., 2, 4, 5, 10, and so forth) to generate the decimated input signal 206 at a lower frequency (e.g., 1 kHz-10 kHz). For example, the CIC filter 204 may downsample the input signal 202 having a 10 kHz frequency by a factor of 5 to generate the decimation filter output signal 206 at a 2 kHz frequency. By downsampling the input signal 202, the signal processing system 200 may reduce the number of computations necessary. The DFT block 210, the RMS block 218, and the buffer 222 may receive the decimated input signal 206. Additionally, any number of additional components of the electric power delivery system 120 may receive and use the output signal 206.

The DFT block 210 may include a lookup table (LUT) based quadrature oscillator 212, a fundamental signal block 214, and a harmonic signal block 216. The lookup table oscillator 212 may receive a frequency tracking signal 208 corresponding to a frequency of the electric power delivery system 120. The frequency tracking signal 208 may allow the LUT quadrature oscillator 212 to track the frequency of the electric power delivery system 120 as it varies. The DFT block 210 may be used to generate fundamental frequency phasors (e.g., angle and magnitude) and harmonic frequency phasors which are obtained by multiplying the decimated input signal 206 with the output of LUT based oscillator block 212 which generates quadrature signals of the fundamental frequency or at harmonics of the power system. A phasor representation of a signal is a complex number describing sinusoidal signal properties (e.g., amplitude, phase, rate of change of phase). The DFT block 210 may be used to compute fundamental signal phasors and any number of harmonic signal phasors based on the frequency tracking signal 208 and the decimated input signal 206. For example, each value of the decimated input signal 206 may be multiplied with a different set of sine and cosine coefficients. The RMS block 218 may receive the decimated input signal 206 from the decimation filter 204 and may assist in determination of RMS values for the decimated input signal 206. For example, the RMS block 218 may square the values from the decimated input signal 206 and may provide the squared values to the first-in-first-out (FIFO) buffer 222. Active power may be calculated in the same way by multiplying signals corresponding to voltage channels with the signals corresponding to current channels.

The FIFO buffer 222 may receive output signals from the DFT block 210 and the RMS block 218. Buffer length may be matched to the lowest power system frequency that will be tracked in a given IED implementation and may contain one cycle of the power system signal at that frequency (e.g., 100 ms long for tracking down to 10 Hz). The buffer 222 may store values from the DFT block 210, RMS block 218, and the decimated input signal 206.

Output of the buffer 222 may be fed to the adjustable length filter 224. The adjustable length filter 224 is used to calculate a weighted sum of the data contained in the FIFO buffer 222 such that the sum is performed over an integer multiple of the power system fundamental frequency signal period. The adjustable length filter 224 may attenuate a very strong double frequency component and its harmonics present at the output of blocks 210 and 218. A perfectly matching rectangular window-based filter may provide infinite attenuation of the double frequency component and the fundamental power system frequency harmonics. A one cycle rectangular filter may also be the shortest filter satisfying this property and simultaneously achieving minimum latency, where the results of a one cycle output quantity can be calculated as soon as the full cycle of the input signal becomes available.

Data in the buffer 222 may be used to calculate and generate a peak based magnitude signal estimate (e.g., Pk_MagSec) 232 based on minimum and maximum values determined over one cycle. For example, the peak magnitude signal 232 may be computed as follows:

$$\text{Pk\_MagSec} = \frac{\text{Max} - \text{Min}}{2*\sqrt{2}} \qquad [1]$$

Data in the buffer 222 may be used to calculate and generate a RMS signal 228 (e.g., RMS_Sec) by taking the square root of the sum of squares performed over one cycle. Data in the buffer 222 may also be used to calculate an average direct current (DC) component value over one cycle of the electric power delivery system 120 and generate the DC signal output 230. Certain IEDs may use phasors in polar form. As such, the data in the buffer 222 may be multiplied with an adjustable length windowing function and summed together to calculate a dot product of the frequency tracked input signal and the sine/cosine signals generated by the LUT quadrature oscillator 212. The dot product available at the output of block 224 may provide real components (Real_Ave) and imaginary components (Imag_Ave) representing input signal phasor in rectangular coordinates.

The post processing part of the adjustable length filter 224 may compute phasor magnitudes as follows:

$$\text{MagSec} = \sqrt{\text{Real\_Ave}^2 + \text{Imag\_Ave}^2} \qquad [2]$$

The post processing part of the adjustable length filter 224 may compute an angle (Ang) of the phasor in polar coordinates as follows:

$$Ang = \tan^{-1}\left(\frac{\text{Real\_Ave}}{\text{Imag\_Ave}}\right) \qquad [3]$$

The post processing part of the adjustable length filter 224 may generate a phasor signal 226 including the magnitude and angle of the phasor in polar coordinates. The post processing part of the adjustable length filter 224 may also perform scaling, phase adjustment, and polar coordinate conversion on other values. The adjustable length filter 224 is executed less often (e.g., every, 1, 2 or 4 ms), whenever the outputs are desired (output signal processing rate) allowing substantial reduction in the number of calculations required.

Figure 3:
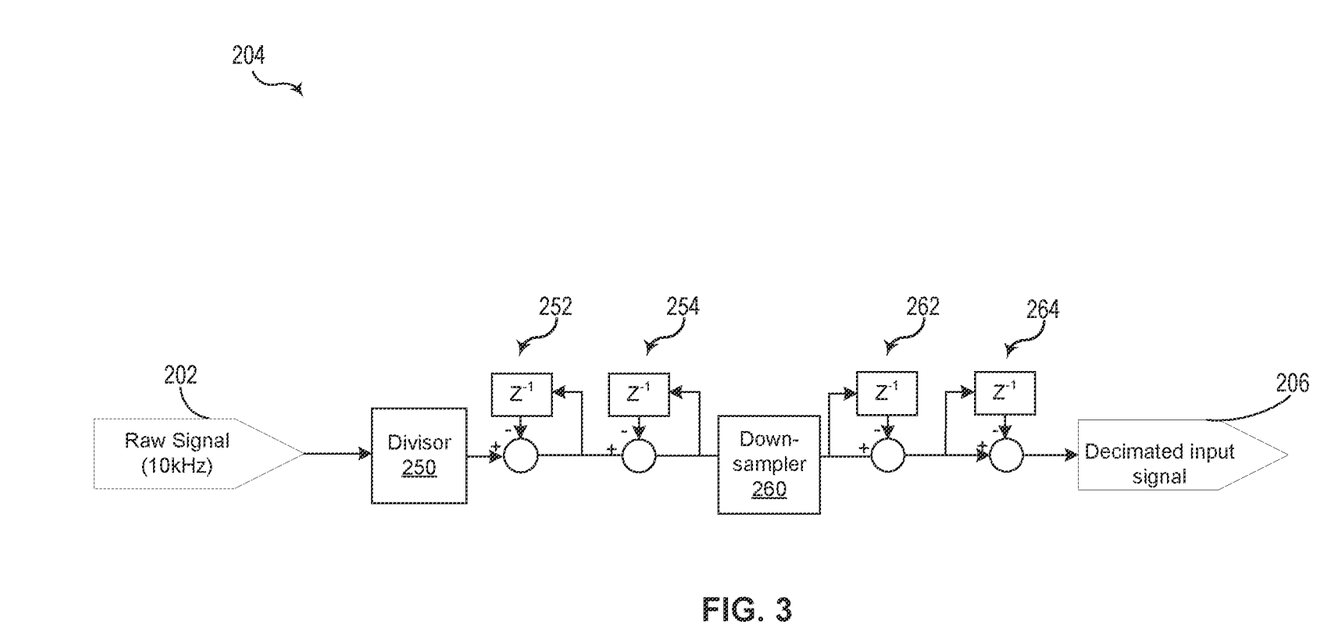
FIG. 3 is a block diagram of a cascaded integrator-comb (CIC) filter of the signal processing system of FIG. 2, in accordance with an embodiment.

FIG. 3 is a block diagram of the CIC based decimation filter 204 of the signal processing system 200, in accordance with an embodiment of the present disclosure. The CIC based decimation filter 204 may include a divisor block 250, integrator stages 252, 254, down-sampler 260, and comb stages 262, 264. The divisor block 250 may generate an output signal by dividing the values of the input signal 202. In some embodiments, the divisor block 250 may divide the values of the input signal 202 according to a maximum bit size for the data values. For example, the maximum bit size may be a 22-bit, 23-bit, 24-bit, 25-bit, 26-bit or 27-bit integer. Each integrator stage may form a comb-integrator pair with a corresponding comb stage. While two integrator stages (e.g., 252, 254) and two comb stages (e.g., 262, 264) are shown in FIG. 3, the CIC filter 204 may include any number of integrator stages and corresponding comb stages. The first integrator stage 252 may receive the output signal from the divisor block 250 as an input signal and may generate an output signal by taking a time integral of the input signal. The second integrator stage 254 may receive the output signal from the first integrator stage 252 and may take a time integral to generate an output signal for the second integrator stage 254. The integrator stages 252, 254 may operate at a rate (e.g., 8-20 kHz) of the input signal 202. It is understood that a person skilled in the art can implement an alternate downsampling filter using a different sets of filter coefficients.

The down-sampler 260 may receive and down-sample the output signal from the second integrator stage 254. In some embodiments, the down-sampler 260 may sample values based on an integer factor (e.g., two, five, ten, and so forth). For example, the integer factor may be five and the down-sampler 260 may sample every fifth value of the output signal from the second integrator stage 254. As such, the down-sampler 260 may reduce the rate of the signal being processed from the input signal 202 (e.g., 8 kHz to 50 MHz) to the output signal 206 (e.g., 1-10 kHz). The comb stages 262, 264 may operate at a rate (e.g., 1-10 kHz) equal to the rate of the output signal of the down-sampler 260. The comb stages 262, 264 may sequentially differentiate the output signal from the down-sampler 260 to generate the decimated input signal 206. Downsampling the input signal 202 reduces the number of input values (e.g., by a factor of two, five, ten, and so forth). As such, the number of computations for the signal processing system 200 are also reduced.

Figure 4:
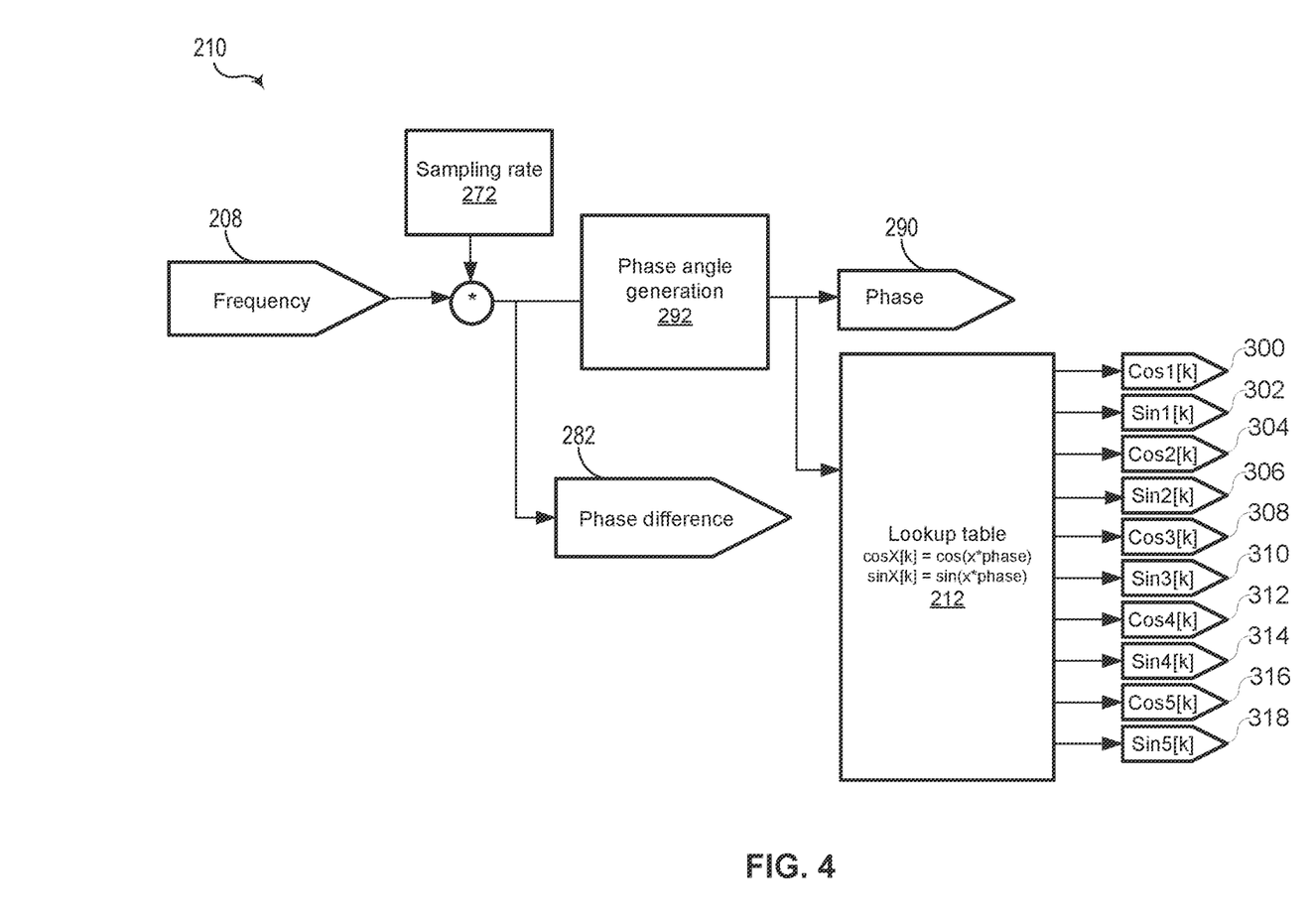
FIG. 4 is a block diagram of a portion of a Discrete Fourier Transform (DFT) process including a lookup table, in accordance with an embodiment.

FIG. 4 is a block diagram of a portion of the DFT block 210 including the lookup table-based quadrature oscillator 212, in accordance with an embodiment of the present disclosure. The lookup table oscillator 212 may receive the frequency tracking signal 208 corresponding to the frequency of the electric power delivery system 120. The DFT block 210 may determine and may generate a phase difference signal 282 based on the frequency tracking signal 208. For example, the DFT block 210 may use information about the input signal sampling rate 272 applicable to the decimation filter output signal 206. In certain embodiments, the sampling rate 272 may correspond to a number of samples per second (e.g., 500-50,000 samples per second). The DFT block 210 may generate the phase difference signal 282 by first converting the frequency tracking signal 208 from Hz to radians by multiplying the frequency tracking signal by two times pi. The DFT block 210 may then divide the result by the sample rate 272 to generate the phase difference signal 282.

The phase angle generation block 292 may include a numerically controlled oscillator (NCO) with a phase accumulator. The NCO may use the period (inverse frequency) measurement to create quadrature sinusoids at the input frequency. The phase accumulator may be used to keep a cumulative sum of the scaled frequency in order to produce a phase that changes at the input frequency. For example:

$$\phi[n] = \phi[n-1] + \frac{2\pi}{F_S T[n]} \quad [4]$$

where $F_S$ is the sample rate and T is the measured period. The phase accumulate may use, for example, zero crossings of the decimated input signal 206 to initialize the cumulative sum of the scaled frequency.

Frequency tracking signal 208 may be derived by measuring the distance between the power system signal zero crossings or by measuring the rate of change of the phase signal obtained from the adjustable length filter 224 and defined by equation [3]. The frequency tracking signal 208 and the sampling rate 272 may be used to generate a filtered phase 290 via the phase angle generation block 292. The filtered phase 290 may then be used by the lookup table oscillator 212 to generate fundamental and harmonic cosine coefficients 300, 304, 308, 312, and 316 and sine coefficients 302, 306, 310, 314, and 318, which may be used to generate quadrature outputs at the fundamental and harmonics at the operating frequency.

Figure 5:
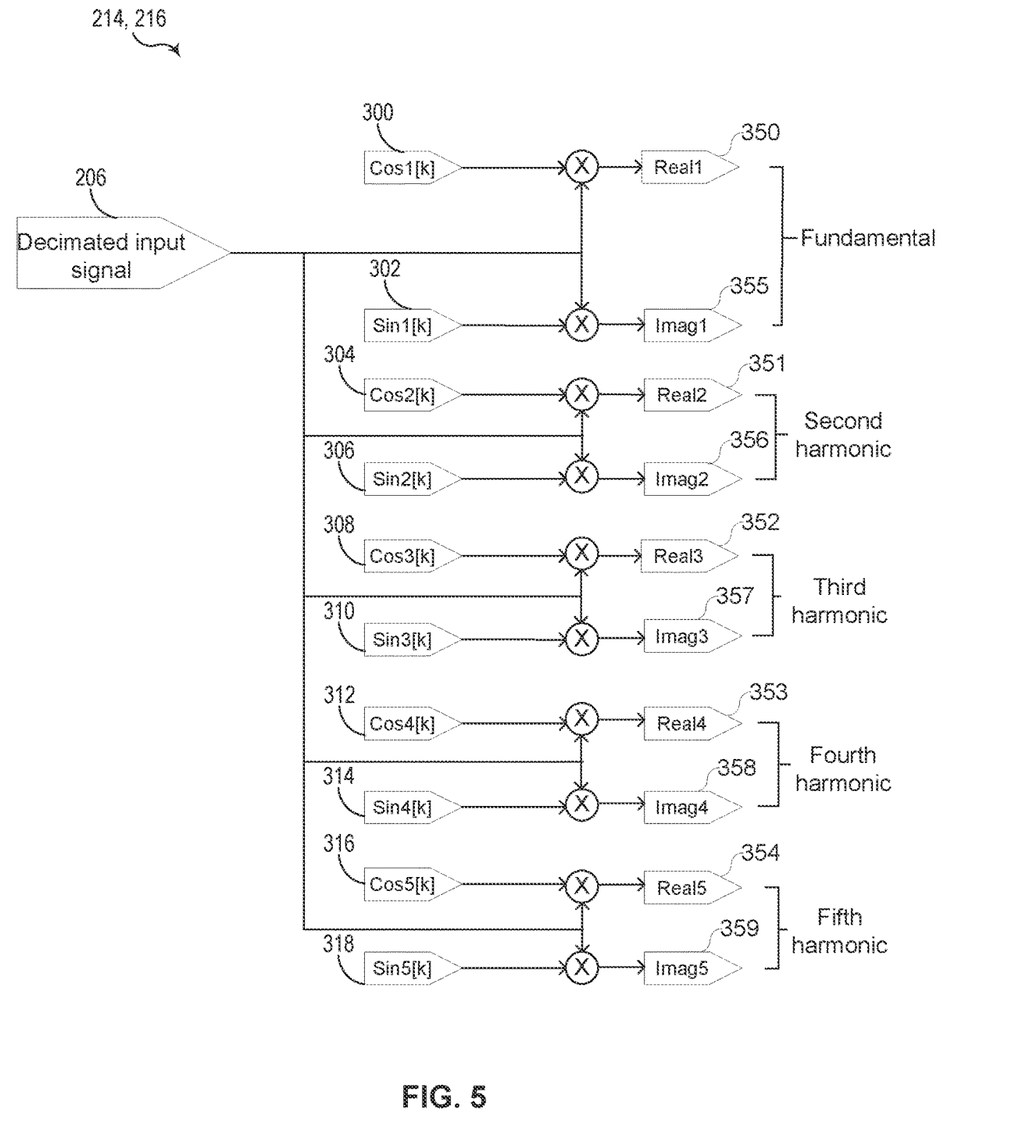
FIG. 5 is a block diagram of fundamental and harmonic signal generation blocks of the DFT process, in accordance with an embodiment.

FIG. 5 is a block diagram of the fundamental signal processing block 214 and harmonic signal processing block 216 of the DFT block 210, in accordance with an embodiment of the present disclosure. The decimated input signal 206 from the CIC decimation filter 204 may be multiplied with the sine and cosine coefficients 300 and 302 matching the power system fundamental frequency and allowing the subsequent blocks to measure the corresponding phasors. In some embodiments, the decimated input signal 206 may be selectively filtered by a high pass filter, such as a MIMIC filter, prior to the multiplication. Further, when the input signal is voltage, the MIMIC filter may be bypassed, and when the input signal is current, the MIMIC filter may filter a decaying DC offset that may be present after the DFT block 210.

Multiplying the decimated input signal 206 with the quadrature outputs manifests as a convolution in the frequency domain. The frequency domain convolution has the property of shifting the frequency spectrum by an amount equal to the applied frequency. Half of the energy associated with the frequency shifts to DC and the other half shifts close to two times the applied frequency. For example, consider the steady state signal:

$$X_m \cos(2\pi f t + \phi) \quad [5]$$

where $X_m$ is the magnitude of the signal, f is the frequency of the signal, t is the current time, and ϕ is the phase. The resulting quadrature output of the sine and cosine signals with coefficients 300 and 302 may be given as:

$$e^{-j\pi ft} = \cos(2\pi ft) - j \sin(2\pi ft) \quad [6]$$

When multiplying the two preceding equations, leveraging product-to-sum trigonometric identities obtains:

$$X_m \cos(2\pi ft + \phi) * e^{-j\pi ft} = \quad [7]$$
$$X_m \left( \frac{\cos(\phi) + j\sin(\phi)}{2} + \frac{\cos(4\pi ft + \phi) - j\sin(4\pi ft + \phi)}{2} \right)$$

The first ($\cos(\phi)$ and $j \sin(\phi)$) term is a DC component that is a complex number that can be converted to polar coordinates using equations [2] and [3] to obtain the phase and the magnitude. The second term is a double frequency component (4πft). Since the integration of cosine and sine (double frequency component terms) over an integer number of signal periods is equal to zero, the remaining term from integrating over a cycle is the DC component. As explained below, the adjustable length filter 224, such as a discrete one cycle average (DOCA), may be used to remove or attenuate the double frequency component thereby leaving the DC component which characterizes the magnitude and phase of the input. Note that the multiplication operation halves the magnitude of the phasor.

The intermediate (i.e., multiplied or heterodyned) cosine signals 350-354 may represent the real portions of equation [7] and the intermediate (i.e., multiplied or heterodyned) sine signals 355-359 may represent the imaginary portions of equation [7] for the fundamental frequency and different harmonic frequencies. That is, the decimated input signal 206 from the CIC decimation filter 204 may be multiplied with the cosine coefficients 300, 304, 308, 312, and 316 and the sine coefficients 302, 306, 310, 314, and 318 to generate the fundamental frequency signals 350 and 355, the second harmonic signal 351 and 356, the third harmonic signal 352 and 357, the fourth harmonic signal 353 and 358, and the fifth harmonic signal 354 and 359, respectively. Higher harmonic signals may be calculated as well. Values from the intermediate signals 350-359 may be stored in the FIFO buffer 322 to be used by the adjustable length filter.

Figure 6:
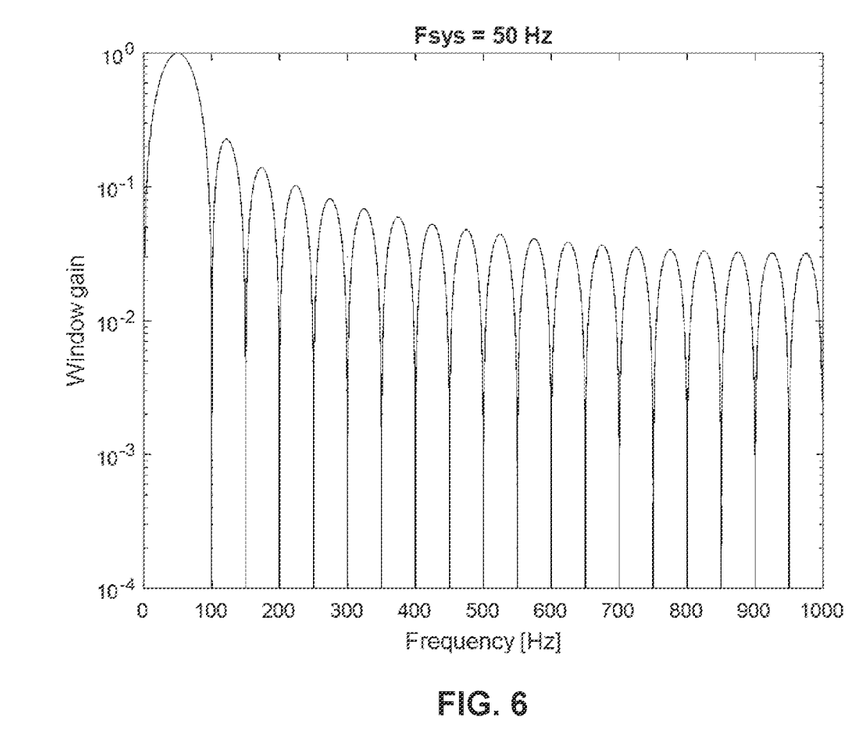
FIG. 6 is a graph of the frequency response of the one cycle rectangular filter commonly used in conventional implementations.

FIG. 6 shows frequency response of the 50 Hz DFT bin with a rectangular window whose length (number of coefficients) matches exactly one cycle of the bin center frequency (e.g., power system fundamental signal frequency). FIG. 6 illustrates behavior of a 20 ms rectangular window with input signal sampling frequency set to 2 kHz. The window has 40 coefficients (2000/50) all of which have equal weight. The rectangular window has infinite attenuation at the multiples of the bin center frequency (e.g., 100, 150, 200, 250 Hz). Infinite attenuation at the multiples of the bin center frequency (center frequency harmonics) is a very desirable property in power system applications allowing independent measurement of individual power system harmonics. As the power system operating frequency changes, the rectangular window length may be adjusted which becomes difficult when operating with a fixed sample rate. For example, with sampling frequency of 2 kHz and power system frequency of 60 Hz, window length would need to be equal to:

$$W_{Length} = \frac{\text{Sampling\_Frequency}}{\text{Signal\_Frequency}} = \frac{2000}{60} = 33.333333 \text{ samples} \quad [8]$$

Figure 7:
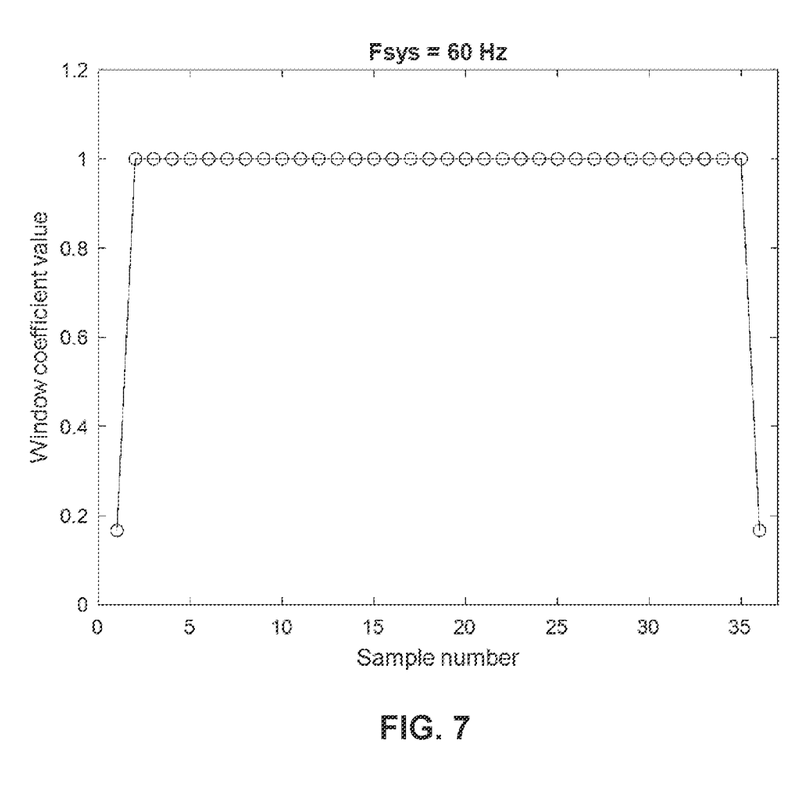
FIG. 7 is a graph of a filter coefficient example for an adjustable length filter, in accordance with an embodiment.

Simply rounding the window length to 33 samples results with attenuation dips moving closer together, failing to provide the necessary attenuation at integer multiples of the desired system frequency. Insufficient attenuation is especially visible on the double frequency ripple which occurs when the measured signal is multiplied with a locally generated signal of the same frequency as shown in FIG. 5. It is therefore desirable to construct a new adjustable window whose properties closely match rectangular window performance, but whose length can be infinitely adjusted in fractional increments. The new adjustable length window is shown in FIG. 7. The window contains a number of coefficients N with equal weight and two additional coefficient (first and last coefficient) whose weight is equal to one half of the window length remainder R.

$$N = \text{floor}(W_{Length}) \quad [9]$$

$$R = W_{Length} - N \quad [10]$$

$$\text{End\_Weight} = \frac{R}{2} \quad [11]$$

One cycle moving average results may be obtained using a finite impulse response (FIR) filter with zeros at the fundamental frequency and each harmonic up to the Nyquist frequency. To improve performance, the IED 140 may use an adjustable length filter, such as a rounded corner boxcar filter (RCBF), with the period measurement to produce a one-cycle filter. Since the discrete boxcar coefficients may not be exactly one cycle for most frequencies, the IED 140 may interpolate or round the end taps or corners of the adjustable length filter to a lesser value than other taps. That is, the IED 140 may interpolate the period to be a non-integer number of samples within one cycle.

To construct the filter, let P be samples per cycle derived as follows:

$$P = F_S * T \quad [12]$$

where $F_S$ is the sample rate and T is the measured period. The number of filter taps may be calculated as:

$$N = \lfloor P \rfloor \quad [13]$$

The taps of the FIR filter may be defined as:

$$h[n] = \begin{cases} \frac{1}{P}, & 1 \leq n \leq (N) \\ \frac{P - (N-2)}{2P}, & n = 0 \text{ or } n = (N \mp 1) \\ 0, & \text{otherwise} \end{cases} \quad [14]$$

The IED may dynamically adjust a length of the adjustable length filter 224 by adjusting the taps based on the measured period to cause the filter to limit the length of measurements to correspond to a cycle. By filtering the intermediate signals 350-359 to be the length of a cycle, the adjustable length filter 224 may remove or attenuate the AC ripple component of equation [7], thereby allowing the IED to estimate the real and imaginary components of the input signal and subsequently obtain the measured signal phase.

Figure 8:
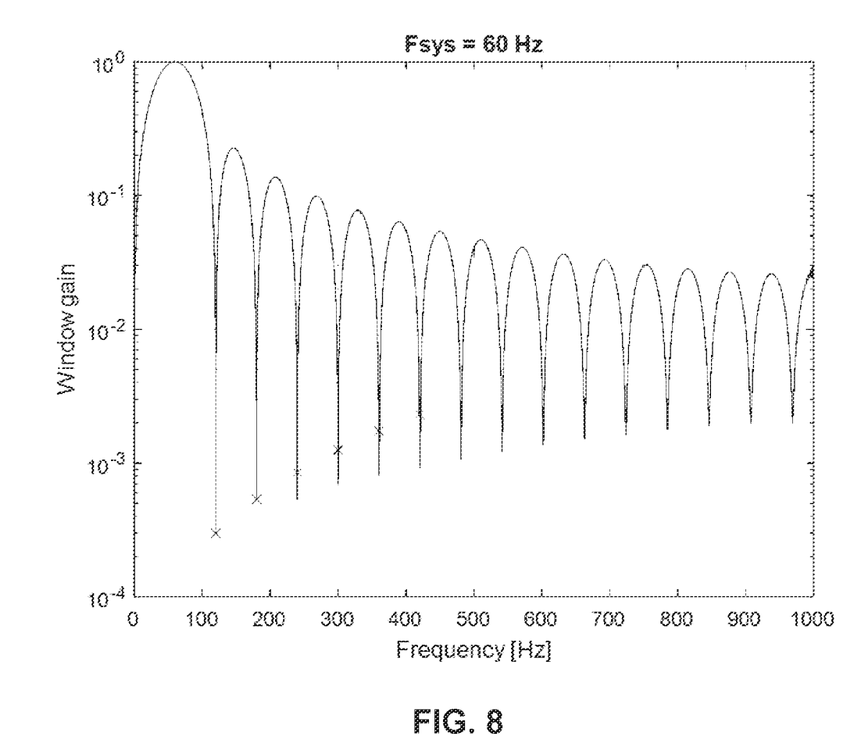
FIG. 8 is a graph of the frequency response for the adjustable length filter example shown in FIG. 7, in accordance with an embodiment.
Figure 9:
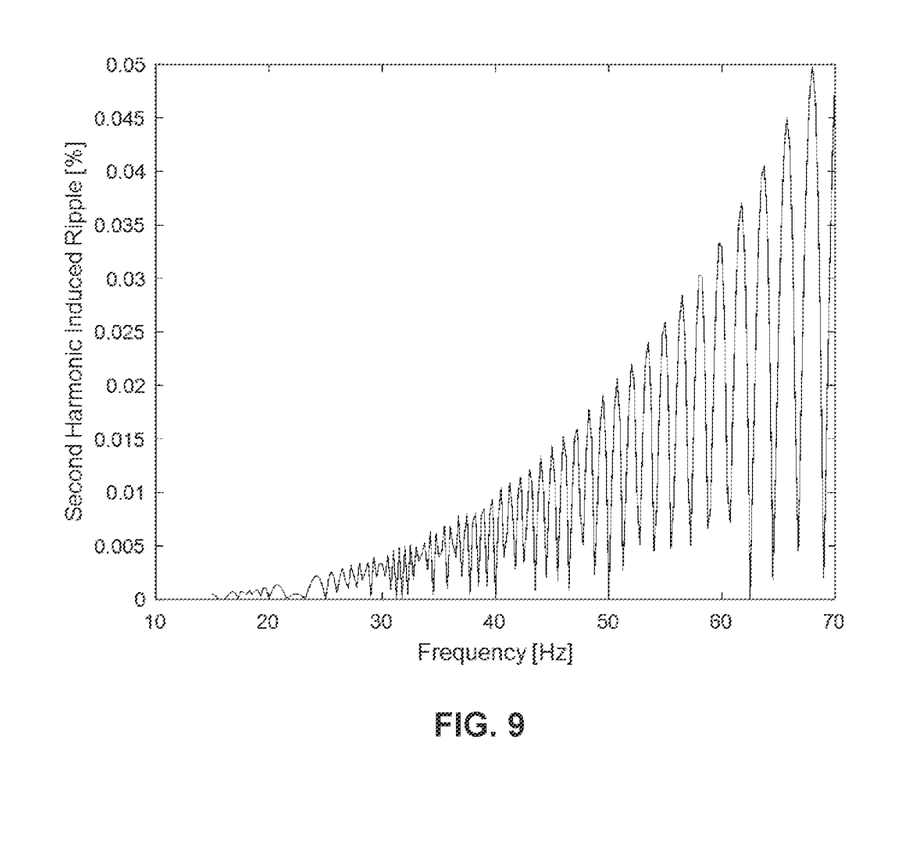
FIG. 9 is a graph of the effect of the finite double frequency signal attenuation (undesirable phasor signal ripple) achieved with the adjustable length filter for an input signal sample rate of 2 kHz and power system fundamental in the 15 to 70 Hz range.

FIG. 7 is an example of the adjustable length filter 224 generated for sampling frequency of 2 kHz and power system frequency of 60 Hz. With $W_{Length}=33.3333333$, N=33, R=0.3333333, and center coefficient weight set to one, end coefficient weight is equal to End_Weight=0.3333333/2=0.1666667. Filter gain is equal to $W_{Length}$ and can be compensated by scaling (dividing) the filter output by the same value. Variable length window frequency domain response corresponding to the above example is shown in FIG. 8. Individual crosses "x" are used to point out attenuation at exact multiples of the bin center frequency ($2^{nd}$ through $7^{th}$ harmonic). Attenuation is finite, but sufficient for most power system application. Error introduced by the variable length window of the adjustable length filter 224 is proportional with the power system frequency and gets smaller as the ratio between the sampling frequency and the measured signal frequency (window length) gets larger. FIG. 9 shows error behavior for a full scan of power system frequencies from 15 to 70 Hz with input signal sampling frequency set to 2 kHz. Error is proportional to the measured signal magnitude and presents itself in the form of ripple which can be reduced through additional averaging.

Since the data is made available in the buffer 222, the adjustable length filter 224 may begin the measuring process at any time, such as according to a protection interval for the IED 140. For example, a protection interval may be one, two, or four milliseconds. The adjustable length filter 224 may implement an adjustable length rectangular window and perform windowed data summation based on one fundamental frequency cycle of the electric power delivery system 120. The frequency of the electric power delivery system 120 may be tracked by the frequency tracking signal 208 and the frequency may vary over time. As such, the length of the RCBF window may vary also. In some embodiments, the adjustable length filter 224 may downsample the values when the frequency of the electric power delivery system 120 drops below a given threshold frequency value. For example, if the frequency drops below 40 Hz, then the adjustable length filter 224 may sample every other value before performing summation. In certain embodiments, the adjustable length window 224 may employ a piecewise interpolation function for downsampling values based on the frequency of the electric power delivery system 120. The IED 140 may compare the frequency to any number of threshold frequencies and may select a downsampling integer factor based on the comparison. For example, a first threshold frequency of 40 Hz may correspond to a downsampling integer factor of two and a second threshold frequency of 20 Hz may correspond to a downsampling integer factor of three. As such, the IED 140 may sample every other value when the frequency is between 40 Hz and 20 Hz and may sample every third value when the frequency is less than 20 Hz. If the frequency is above a minimum threshold frequency (e.g., 40 Hz), the IED 140 may use every value in calculating the results.

It is understood that a person skilled in the art may implement variations of the adjustable length window described above. For example, an asymmetrical window may be constructed with one instead of two additional samples. A weight of the extra sample may be equal to the value of the remainder, with the extra sample placed at the beginning or at the end of the observation window. Additionally or alternatively, longer windows with fast Gaussian taper, 3, 4 or any number of extra samples are also possible.

Figure 10:
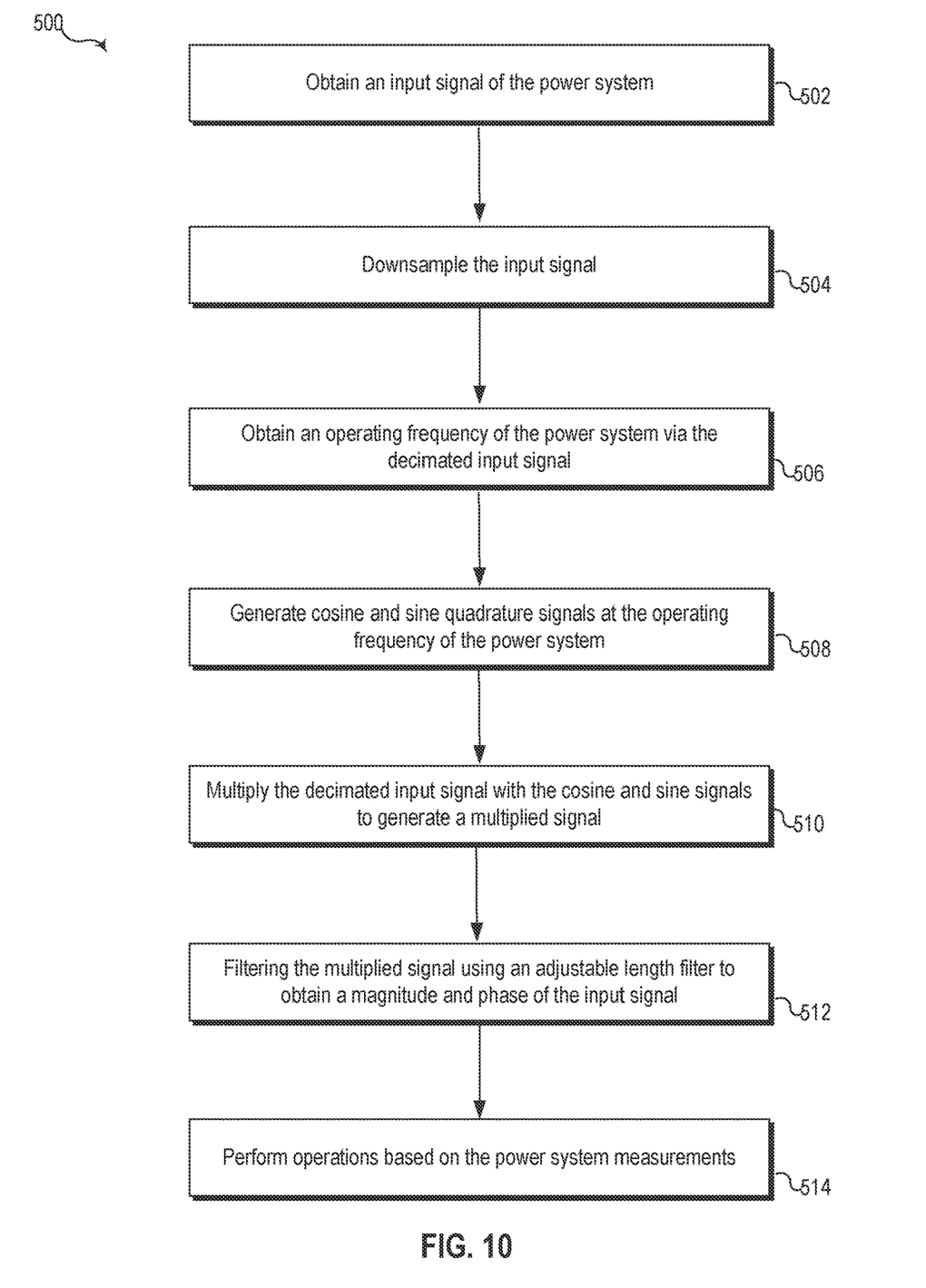
FIG. 10 is a flowchart of a method used for signal processing, in accordance with an embodiment.

FIG. 10 illustrates a flowchart of a method 500 for performing the signal processing on a variable frequency power system with the IED 140 that operates at a fixed sampling rate, in accordance with an embodiment of the present disclosure. The method 500 is described from the perspective of an IED, however, the method 500 may be performed by any other device of the electric power delivery system 120. In some embodiments, the method 500 may be implemented by executing instructions stored in a tangible, non-transitory, computer-readable medium, such as the memory 162, using the processor 160. While the method 500 is described using steps in a specific sequence, it should be understood that the present disclosure contemplates that the described steps may be performed in different sequences than the sequence illustrated, and certain described steps may be skipped or not performed altogether.

At block 502, the IED 140 may receive an input signal, such as input signal 202 in FIG. 2. The input signal may be a multi-channel (e.g., 2, 4, 6, 8 channels) signal and/or may be a high frequency (e.g., 8 kHz to 50 MHz) signal, such as a multi-phase voltage or multi-phase current. The IED 140 may perform any number of signal processing steps on the input signal 202, such as downsampling, upsampling, interpolation, filtering, amplification, averaging, and so forth.

At block 504, the IED 140 may downsample the input signal 202. For example, the IED 140 may sample values of the input signal 202 at an integer decimation rate (e.g., 2, 4, 5, 10, and so forth) and may generate the decimated input signal 206. After downsampling, the number of values in the decimated input signal 206 is reduced by factor equal to the integer decimation rate when compared to the input signal 202. The IED 140 may perform any number of additional signal processing steps on the decimated input signal, such as filtering, amplification, discrete Fourier transform, root mean square, averaging, and so forth. By downsampling and reducing the number of values, the number of computations performed in any additional signal processing steps on the decimated input signal 206 is also reduced.

At block 506, the IED 140 may track a variable operating frequency of the electric power delivery system 120. For example, the IED 140 may receive the frequency tracking signal 208 corresponding to the variable frequency of the electric power delivery system 120 by using zero crossings and/or rate of change of phase of the decimated input signal 206. At block 508, the IED 140 may generate a set of quadrature signals based on the variable frequency using a lookup table of cosine and sine values. Additionally or alternatively, the IED 140 may generate any number of harmonic signal measurements based on the decimated input signal 206 by using sine and cosine coefficients corresponding to each harmonic signal.

At block 510, the IED 140 may multiply the decimated input signal 206 with the cosine and sine signals to generate an intermediate signal. At block 512, the IED 140 may filter the intermediate signal using the adjustable length filter 224 to obtain a magnitude and phase of the decimated input signal 206. For example, the adjustable length filter 224 may have a length that corresponds to a cycle of the electric power delivery system 120.

At block 514, the IED 140 may perform operations based on the power system measurements obtained from the filtered signal. For example, the phase and the magnitude of the power system voltage or current waveform may be obtained from filtering the intermediate signal. The phase and magnitude may be used to obtain various other power system quantities. For example, the IED 140 may determine a root mean square (RMS) value for the decimated input signal 206 by squaring the values of the decimated input signal 206 and summing the squared values over a cycle of the electric power delivery system 120.

The power system measurements, such as phase, frequency, rate of change of frequency, etc., obtained by the IED 140 using the processes described herein may be used in various ways. For example, by tracking measurements obtained from the varying frequency of the electric power delivery system 120 with a constant sampling rate, the IED 140 may communicate time-aligned measurements that were obtained at the same time as measurements obtained from other IEDs 148. That is, the IED 140 may synchronize the timing in which measurements are obtained with the timing in which other IEDs obtain measurements using the clock synchronization signal 152. The IED 140 may time stamp the measurements and communicate the measurements and the associated time stamps for use with other measurements at the time stamps obtained from other IEDs in the power system. By having time-aligned measurements obtained at the same time, processing and computations using the measurements at the central monitoring station 150 or the IEDs 140 and 148 may be performed faster and simpler, thereby improving monitoring and protection of the power system. In certain embodiments, the IED 140 may perform control or protection operations using the measurements. For example, the IED 140 may send a signal to trip the circuit breaker 146 to reduce load on the electric power delivery system based on the estimated frequency falling below a set threshold. Further, the IED 140 may display, via a display of the IED, the measurements on a display of the IED 140.

While specific embodiments are described above, in an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed above. These examples are not intended to limit the scope of the disclosure. Indeed, the present disclosure may encompass a variety of forms that may be similar to or different from the examples set forth above.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An intelligent electronic device (IED) comprising:
processing circuitry; and
a memory comprising instructions, wherein the instructions, when executed by the processing circuitry, are configured to cause the processing circuitry to perform operations comprising:
obtaining electrical measurements of an input signal of a power system, wherein the electrical measurements are obtained at a sampling frequency and the input signal is indicative of an operating frequency of the power system;
generating an intermediate signal from the input signal, wherein the intermediate signal has a direct current (DC) component indicative of a magnitude and a phase of the input signal;
storing the intermediate signal comprising in-phase and quadrature components in a first-in-first-out (FIFO) buffer; and
filtering the intermediate signal using an adjustable length rounded-corner boxcar filter comprising a plurality of taps to generate the magnitude and the phase of the input signal, wherein a length of the adjustable length rounded-corner boxcar filter varies based at least in part on a period measurement of the power system, and wherein end taps of the plurality of taps are interpolated to a lesser value than all other taps of the plurality of taps.

2. The IED of claim 1, wherein the instructions, when executed by the processing circuitry, are configured to cause the processing circuitry to perform operations comprising varying the length of the adjustable length rounded-corner boxcar filter to match one cycle of the input signal based on the operating frequency.

3. The IED of claim 1, wherein the instructions, when executed by the processing circuitry, are configured to cause the processing circuitry to perform operations comprising interpolating the length of the adjustable length rounded-corner boxcar filter to be a non-integer number of samples within the period.

4. The IED of claim 1, wherein the instructions, when executed by the processing circuitry, are configured to cause the processing circuitry to perform operations comprising:
determine phase angles of the power system from the operating frequency and the sampling frequency; and
determine, via a lookup table of sinusoidal values, a set of cosine values and a set of sine values based on the phase angle.

5. The IED of claim 4, wherein the instructions, when executed by the processing circuitry, are configured to cause the processing circuitry to perform operations comprising:
generating a cosine signal and a sine signal from the cosine values and the sine values; and
multiplying the cosine signal and the sine signal with the input signal to obtain the intermediate signal such that:

$$X_m\left(\frac{\cos(\phi) + j\sin(\phi)}{2} + \frac{\cos(4\pi ft + \phi) - j\sin(4\pi ft + \phi)}{2}\right)$$

where Xm is an amplitude of the input signal, f is a frequency of the input signal, t is a current time, and $\phi$ is the phase, wherein the adjustable length rounded-corner boxcar filter reduces or removes an alternating current (AC) component.

6. The IED of claim 1, wherein the instructions, when executed by the processing circuitry, are configured to cause the processing circuitry to perform operations comprising filtering a double frequency component of the intermediate signal to leave the DC component, thereby allowing characterization of the magnitude and the phase.

7. The IED of claim 1, wherein the sampling frequency is a constant rate independent of the operating frequency of the power system that varies over time.

8. The IED of claim 1, wherein the instructions, when executed by the processing circuitry, are configured to cause the processing circuitry to perform operations comprising decimating the input signal to a lower rate than an initial input signal.

9. The IED of claim 1, wherein the instructions, when executed by the processing circuitry, are configured to cause the processing circuitry to perform operations comprising filtering the intermediate signal according to a protection interval.

10. A method comprising:
obtaining, via an intelligent electronic device (IED), electrical measurements of an input signal of a power system, wherein the electrical measurements are obtained at a sampling frequency and the input signal is indicative of an operating frequency of the power system;
generating an intermediate signal by multiplying the input signal with quadrature signals, wherein the intermediate signal has a direct current (DC) component indicative of a magnitude and a phase of the input signal;
storing the intermediate signal comprising in phase and quadrature components in a first-in-first-out (FIFO) buffer; and
filtering, via the IED, the intermediate signal using an adjustable length rounded-corner boxcar filter comprising a plurality of taps to generate the magnitude and the phase of the input signal, wherein a length of the adjustable length rounded-corner boxcar filter varies based at least in part on a period measurement of the power system, and wherein end taps of the plurality of taps are interpolated to a lesser value than all other taps of the plurality of taps.

11. The method of claim 10, wherein the quadrature signals are at a frequency corresponding to the operating frequency of the power system.

12. The method of claim 10, wherein the operating frequency is determined by zero crossings of the input signal, rate of change of phase of the input signal, or a combination thereof.

13. The method of claim 10, comprising dynamically adjusting taps of the adjustable length rounded-corner boxcar filter based on the period measurement to cause the adjustable length rounded-corner boxcar filter to limit the length of a filtered signal to correspond to a cycle of the power system.

14. The method of claim 10, comprising synchronizing times in which the electrical measurements are obtained with times in which electrical measurements are obtained by at least one other IED, independent of the operating frequency of the power system.

15. The method of claim 10, comprising interpolating the length of the adjustable length rounded-corner boxcar filter to match a non-integer number of samples within the period.

16. A tangible, non-transitory, computer-readable medium comprising instructions, wherein the instructions, when executed by processing circuitry, are configured to cause the processing circuitry to perform operations comprising:

obtaining electrical measurements of an input signal of a power system, wherein the electrical measurements are obtained at a sampling frequency and the input signal is indicative of an operating frequency of the power system;

generating an intermediate signal from the input signal by multiplying quadrature signals with the input signal, wherein the intermediate signal has a direct current (DC) component indicative of a magnitude and a phase of the input signal;

storing the intermediate signal comprising in phase and quadrature components in a first-in-first-out (FIFO) buffer; and filtering the intermediate signal using an adjustable length rounded-corner boxcar filter comprising a plurality of taps to obtain the magnitude and the phase of the input signal, wherein a length of the adjustable length rounded-corner boxcar filter varies based at least in part on a period measurement of the power system, and wherein end taps of the plurality of taps are interpolated to a lesser value than all other taps of the plurality of taps.

17. The tangible, non-transitory, computer-readable medium of claim 16, wherein the instructions, when executed by the processing circuitry, are configured to generate a root means square (RMS) signal based on the magnitude and the phase.

18. The tangible, non-transitory, computer-readable medium of claim 16, wherein the instructions, when executed by the processing circuitry, are configured to cause the processing circuitry to perform operations comprising performing a protection operation on the power system based at least in part on the magnitude and the phase.

19. The tangible, non-transitory, computer-readable medium of claim 16, wherein the instructions, when executed by the processing circuitry, are configured to cause the processing circuitry to perform operations comprising:

determining that a fault is present in the power system based at least in part on the magnitude and the phase of the input signal; and sending a signal to a circuit breaker of the power system to electrically disconnect at least a portion from the remaining power system.

20. The tangible, non-transitory, computer-readable medium of claim 16, wherein the instructions, when executed by the processing circuitry, are configured to cause the processing circuitry to perform operations comprising dynamically adjusting taps of the adjustable length rounded-corner boxcar filter based on the period measurement to cause the adjustable length rounded-corner boxcar filter to limit the length of a filtered signal to match one or more powers system cycles.

* * * * *